United States Patent [19]

Tatsumi

[11] Patent Number: 5,297,179
[45] Date of Patent: Mar. 22, 1994

[54] DOUBLING CIRCUIT
[75] Inventor: Satoshi Tatsumi, Tokyo, Japan
[73] Assignee: NEC Corporation, Japan
[21] Appl. No.: 874,631
[22] Filed: Apr. 27, 1992
[30] Foreign Application Priority Data
Apr. 30, 1991 [JP] Japan .................. 3-128572
[51] Int. Cl.5 ............................................ H03B 19/00
[52] U.S. Cl. ........................................ 377/47; 328/20;
307/603; 307/471
[58] Field of Search ................ 307/219.1, 471, 603;
328/20; 377/46, 47

[56] References Cited
U.S. PATENT DOCUMENTS
5,010,561 4/1991 Itoh .......................................... 377/47

Primary Examiner—William L. Sikes
Assistant Examiner—Shawn Riley
Attorney, Agent, or Firm—Laff, Whitesel, Conte & Saret

[57] ABSTRACT

A doubling circuit for adjusting the duty ratio of an output signal automatically and implemented as a digital circuit. A variable delay circuit delays an input signal while an exclusive-OR (EOR) gate produces EOR of the output signal of the delay circuit and the input signal. The resulting output of the EOR gate has a frequency double the frequency of the input signal. A low pass filter (LPF) filters the output signal of the EOR gate to produce a means voltage thereof. An integrating circuit integrates a difference between the output voltage of the LPF and a reference voltage. The delay of the variable delay circuit is controlled by the output of the integrating circuit. As a result, the doubled signal from the EOR gate has the duty ratio thereof automatically adjusted.

4 Claims, 3 Drawing Sheets

DOUBLING CIRCUIT

BACKGROUND OF THE INVENTION

The present invention relates to a doubling circuit for doubling the frequency of an input signal and, more particularly, to a doubling circuit for adjusting the duty ratio of an output signal thereof automatically and implemented as a digital circuit.

A conventional doubling circuit for the above application has an input matching circuit to which an input signal is applied, a non-linear circuit implemented by a transistor, and an output matching circuit to which a load is connected. The input matching circuit matches the input signal to the input portion of the non-linear circuit while the output matching circuit 14 matches a signal whose frequency is double the frequency of the input signal to the output portion of the non-linear circuit. In operation, the input signal is routed through the input matching circuit to the non-linear circuit to be distorted thereby. As a result, high frequencies which are integral multiples of the frequency of the input signal appear at the output portion of the non-linear circuit. As the output signal of the non-linear circuit is applied to the output matching circuit, the matching circuit selects only the frequency double the frequency of the input signal from the input signal. The resulting output signal of the matching circuit, i.e., a signal whose frequency is double the frequency of the input signal is fed to the load.

As stated above, it has been customary to match the frequency at stages just before and just after the non-linear circuit. This makes it difficult to adjust the duty ratio of the output signal to, for example, 50 percent and, therefore, requires troublesome adjustment every time the circuit is reproduced. Although the non-linear circuit may be implemented by a coil or similar analog element, an analog element is apt to introduce errors in the circuitry due to the scattering among such elements and, moreover, obstructs the LSI configuration of the circuit. In addition, the conventional doubling circuit is not applicable to a digital configuration unless a signal having a sinusoidal waveform is transformed to a signal having a rectangular waveform.

SUMMARY OF THE INVENTION

It is therefore an object of the present invention to provide a doubling circuit which adjusts the duty ratio of an output signal thereof automatically and can be implemented as a digital circuit.

In accordance with the present invention, a doubling circuit for doubling a frequency of an input signal comprises a variable delay circuit for delaying the input signal to produce a delayed signal, an exclusive-OR (EOR) gate for EORing the delayed signal from the variable delay circuit and the input signal to produce an EOR signal, low pass filter (LPF) for filtering the EOR signal from the EOR gate to produce a filtered signal, and an integrating circuit for integrating a voltage difference between the filtered signal from the LPF and a reference voltage to produce an integrated signal. The variable delay circuit delays the input signal a period of time controlled by the integrated signal from the integrating circuit.

Also, in accordance with the present invention, a method of doubling a frequency of an input signal comprises the steps of delaying the input signal a predetermined period of time to produce a delayed signal, EORing the input signal and the delayed signal to produce an EOR signal, low-pass filtering the EOR signal to produce a filtered signal, and integrating a voltage difference between the filtered signal and a reference signal, whereby the predetermined period of time by which the input signal is to be delayed is controlled.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
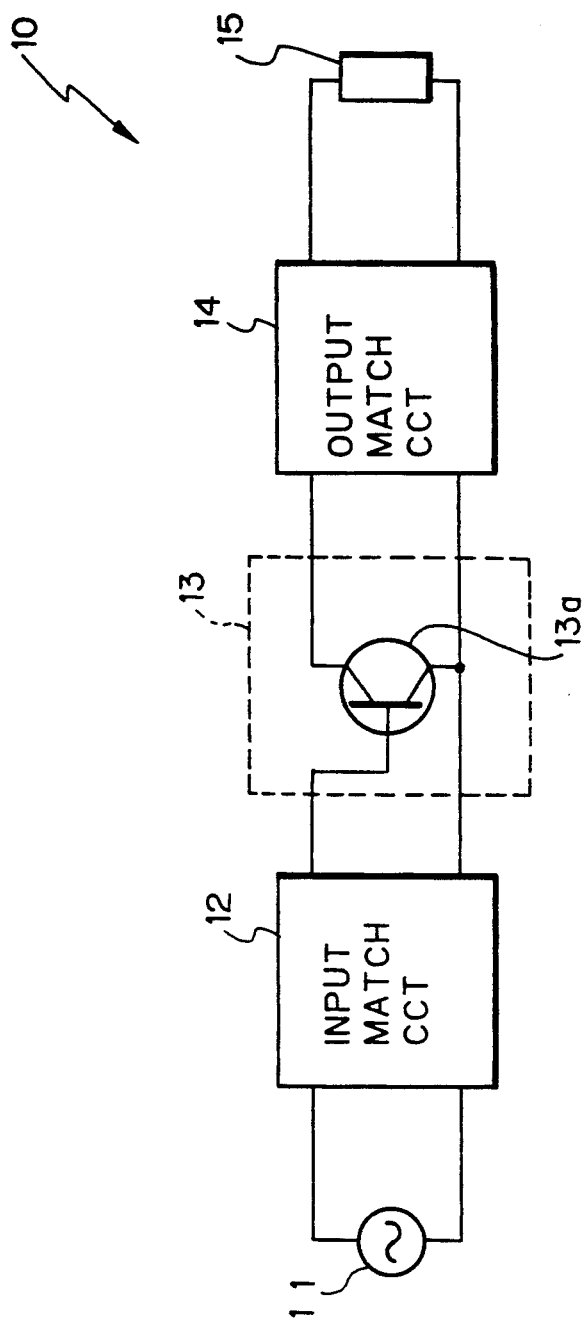
FIG. 1 is a block diagram schematically showing a conventional doubling circuit.

To better understand the present invention, a brief reference will be made to a conventional doubling circuit, shown in FIG. 1. As shown, the doubling circuit, generally 10, is made up of an input matching circuit 12 to which an input signal 11 is applied, a non-linear circuit 13 implemented by a transistor 13a, and an output matching circuit 14 to which a load 15 is connected. The input matching circuit 12 matches the input signal 11 to the input portion of the non-linear circuit 13. The output matching circuit 14 matches a signal whose frequency is double the frequency of the input signal 11 to the output portion of the non-linear circuit 13.

In operation, the input signal 11 is routed through the input matching circuit 12 to the non-linear circuit 13 and distorted by the circuit 13. As a result, high frequencies which are integral multiples of the frequency of the input signal 11 appear at the output portion of the non-linear circuit 13. As the output signal of the non-linear circuit 13 is applied to the output matching circuit 14, the matching circuit 14 selects only the frequency double the frequency of the input signal 11 from the input signal. The resulting output signal of the matching circuit 14, i.e., a signal whose frequency is double the frequency of the input signal 11 is fed to the load 15.

As stated above, the conventional doubling circuit 10 matches the frequency at stages just before and just after the non-linear circuit 13. This makes it difficult to adjust the duty ratio of the output signal to, for example, 50 percent and, therefore, results in the need for troublesome adjustment every time the circuit is reproduced, as discussed earlier. While the non-linear circuit 13 may be implemented by a coil or similar analog element, an analog element is apt to introduce errors in the circuitry due to the scattering among such elements and, moreover, obstructs the LSI configuration of the circuit 10. In addition, the doubling circuit 10 is not applicable to digital circuitry unless a signal having a sinusoidal waveform is transformed to a signal having a rectangular waveform.

Figure 2:
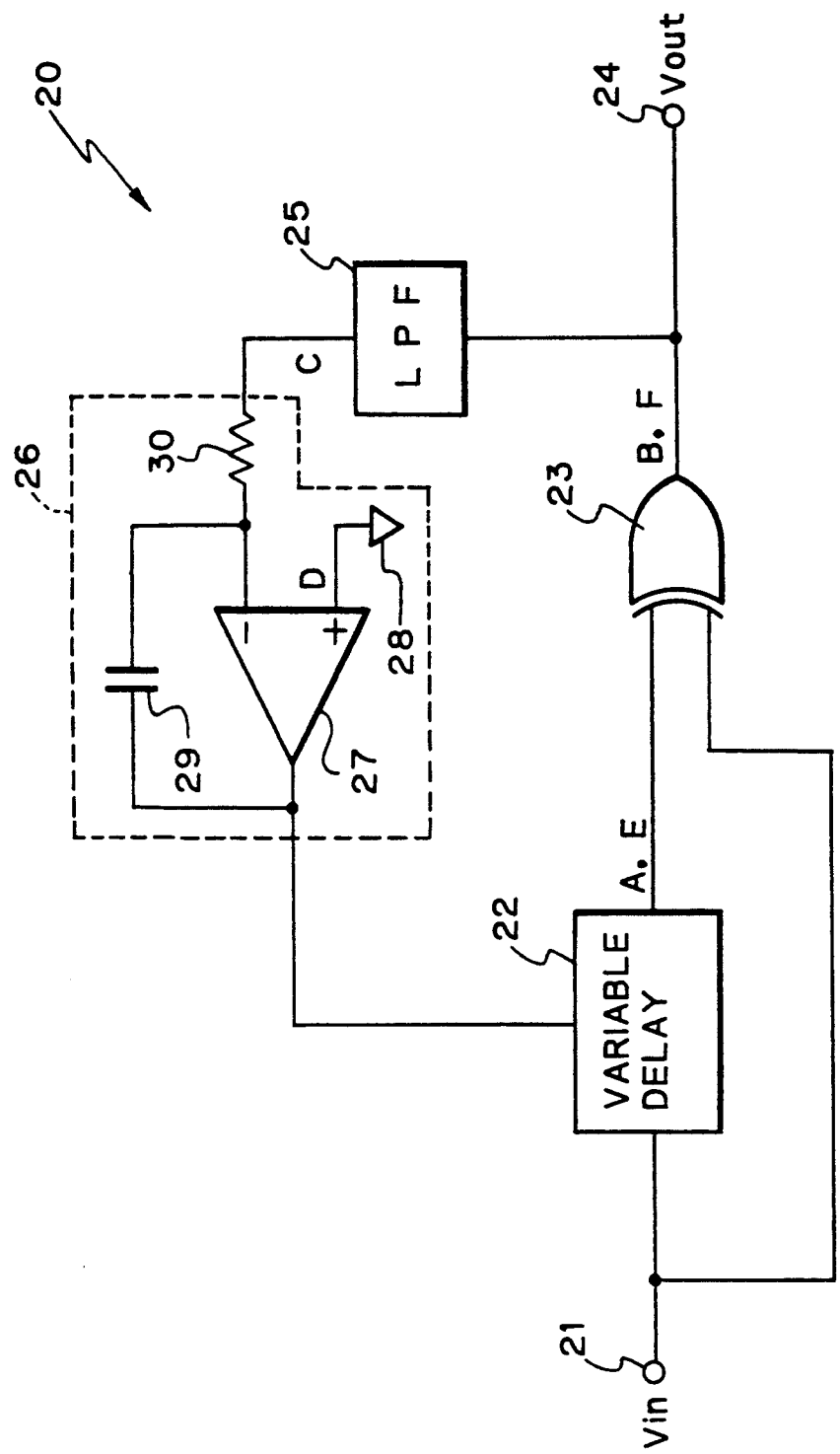
FIG. 2 is a block diagram schematically showing a doubling circuit embodying the present invention.

Referring to FIG. 2, a doubling circuit embodying the present invention is shown and generally designated by the reference numeral 20. As shown, the doubling circuit 20 has an input terminal 21 to which an input signal Vin having a rectangular waveform is applied. A variable delay circuit 22 delays the input signal Vin a controllable period of time, which will be described, to produce an output signal A or E. An exclusive-OR (EOR) gate 23 EORs the output signal A or E of the variable delay circuit 22 and the input signal Vin fed from the input terminal 21. The output signal, i.e., EOR signal B or F of the EOR gate 23 is fed out via an output terminal 24 as an output signal Vout while being delivered to a low-pass filter (LPF) 25. The LPF 25 produces a mean voltage C of the signal B or F by filtering the signal B or F. An integrating circuit 26 has an operational amplifier (OP AMP) 27, a reference voltage terminal 28, a capacitor 29, and a resistor 30. The output voltage C of the LPF 25 is applied to the inverting input of the OP AMP 27 via the resistor 30 while a reference voltage D is applied to the non-inverting input of the OP AMP 27 via the reference voltage terminal 28. The OP AMP 27 integrates a difference between the input voltages C and D. The resulting output of the OP AMP 27 is delivered to the variable delay circuit 22 and is fed back to the inverting input of the OP AMP 27 via the capacitor 29. The delay of the variable delay circuit 22 is controlled by the output of the integrating circuit 26.

Figure 3:
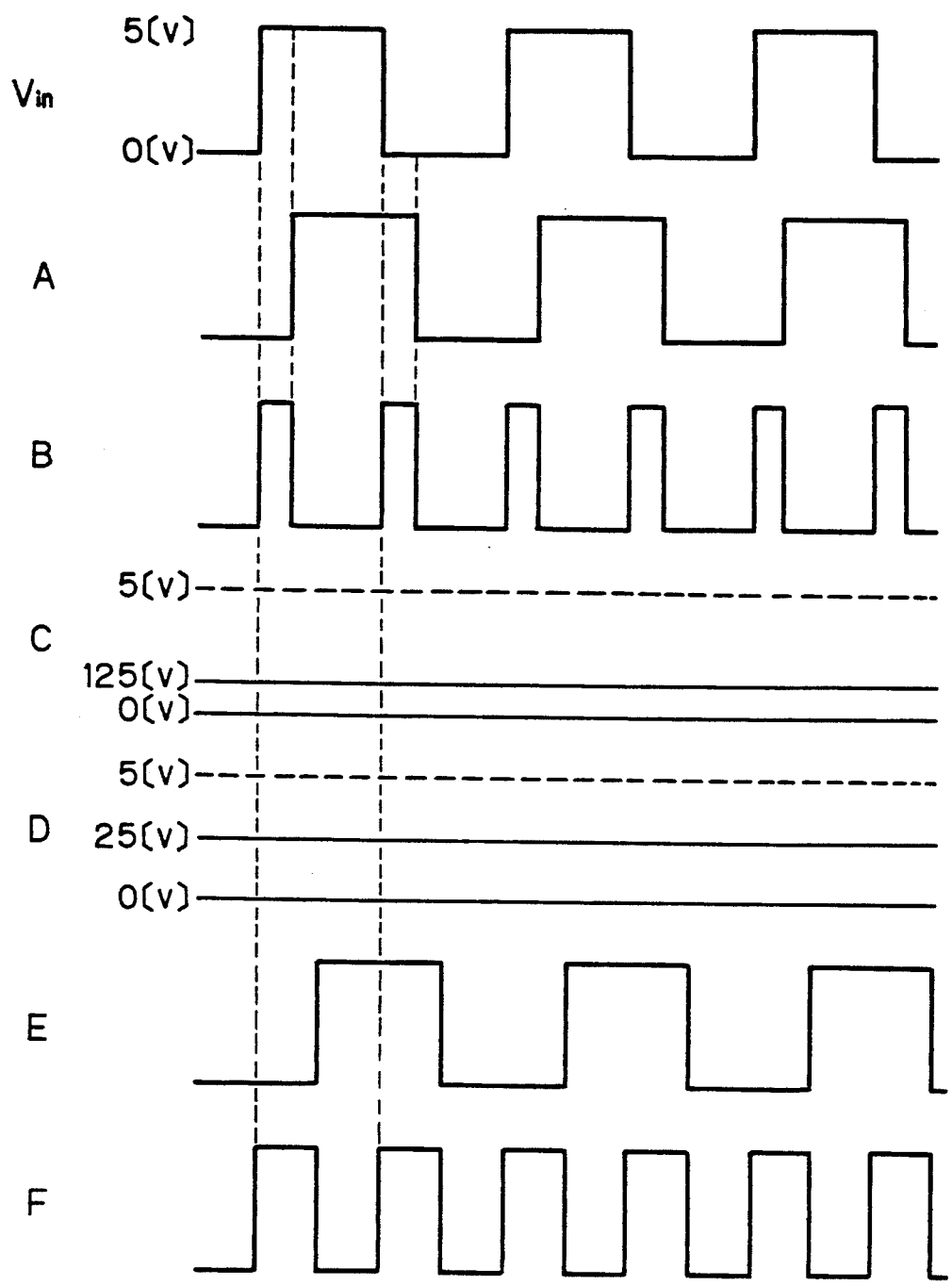
FIG. 3 is a timing chart representative of a specific operation of the embodiment.

The operation of the doubling circuit 20 will be described with reference also made to FIG. 3. To begin with, assume that the delay of the variable delay circuit 22 is controlled to one-eighth of the period of the input signal Vin by way of example. Then, the variable delay circuit 22 outputs the signal A. The EOR gate 23 produces EOR of the input signal Vin and the delayed signal A, i.e., the signal B whose frequency is double the frequency of the input signal Vin. Since the delay of the variable delay circuit 22 is one-eighth of the period of the input signal, the EOR signal B has a duty ratio of about 25 percent. The LPF 25 filters the signal B having a duty ratio of 25 percent to thereby output a mean voltage C of 1.25 volts. The mean voltage C is proportional to the duty ratio of the signal B, e.g., the former is 2.5 volts if the later is 50 percent or 5 volts if the latter is 100 percent.

To give the output signal B of the EOR gate 23 a duty ratio of, for example, 50 percent, the reference voltage D applied to the integrating circuit 26 is adjusted to 2.5 volts. As the output of the integrating circuit 26 is fed back to the variable delay circuit 22, the delay of the delay circuit 22 is controlled to one-fourth of the period of the input signal Vin. As a result, the variable delay circuit 22 produces the other signal E. Then, the EOR gate 23 produces EOR of the input signal Vin and the signal E, i.e., the signal F having a duty ratio of about 50 percent. By such a procedure, the input signal Vin is doubled in frequency to output a signal whose duty ratio is about 50 percent.

As stated above, only if the reference voltage D to be applied to the integrating circuit 26 is adequately selected, the embodiment adjusts the duty ratio of the doubled signal automatically in response to the output of the integrating circuit 26, i.e., the result of integration of the difference between the output voltage of the LPF 25 and the reference voltage D. This eliminates the need for the conventional complicated adjustment. Further, since the doubling circuit 20 is entirely implemented as a digital circuit including no analog elements, it is free from errors ascribable to the scattering among elements and can be readily incorporated in an LSI configuration.

In summary, it will be seen that the present invention provides a doubling circuit which adjusts the duty ratio of a doubled signal automatically and, therefore, does not need any complicated adjustment when reproduced. This unprecedented advantage is derived from the unique construction wherein a low pass filter filters a doubled signal, an integrating circuit integrates a difference between the output voltage of the low pass filter and a reference voltage, and a variable delay circuit has the delay thereof controlled by the output of the integrating circuit. Another advantage achievable with the invention is that since the doubling circuit is implemented as a digital circuit including no analog elements, it eliminates errors ascribable to the scattering among elements and can be incorporated in an LSI configuration with ease.

Various modifications will become possible for those skilled in the art after receiving the teachings of the present disclosure without departing from the scope thereof.

What is claimed is:

1. A doubling circuit for doubling a frequency of an input signal, comprising:
   variable delay means for delaying the input signal to produce a delayed signal;
   exclusive-OR (EOR) gate means for EORing the delayed signal from said variable delay means and the input signal to produce an EOR signal;
   low pass filter (LPF) means for filtering the EOR signal from said EOR gate means to produce a filtered signal; and
   integrating circuit means for integrating a voltage difference between the filtered signal from said LPF means and a reference voltage to produce an integrated signal;
   said variable delay means delaying the input signal a period of time controlled by the integrated signal from said integrating circuit means.

2. A doubling circuit as claimed in claim 1, wherein the period of time set in said variable delay means is one-fourth of a period of the input signal.

3. A method of doubling a frequency of an input signal, comprising the steps of:
   (a) delaying the input signal a predetermined period of time to produce a delayed signal;
   (b) EORing the input signal and the delayed signal to produce an EOR signal;
   (c) low-pass filtering the EOR signal to produce a filtered signal; and
   (d) integrating a voltage difference between the filtered signal and a reference signal, whereby the period of time by which the input signal is to be delayed is controlled.

4. A doubling circuit as claimed in claim 3, wherein step (d) comprises (d) controlling the period of time to one-fourth of a period of the input signal.

* * * * *